(12) United States Patent
Huang et al.

(10) Patent No.: US 11,563,119 B2
(45) Date of Patent: Jan. 24, 2023

(54) ETCHSTOP REGIONS IN FINS OF SEMICONDUCTOR DEVICES

(71) Applicant: Intel Corporation, Santa Clara, CA (US)

(72) Inventors: Cheng-Ying Huang, Hillsboro, OR (US); Willy Rachmady, Beaverton, OR (US); Gilbert Dewey, Hillsboro, OR (US); Erica J. Thompson, Beaverton, OR (US); Aaron D. Lilak, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 216 days.

(21) Appl. No.: 16/650,834

(22) PCT Filed: Dec. 27, 2017

(86) PCT No.: PCT/US2017/068473
§ 371 (c)(1),
(2) Date: Mar. 25, 2020

(87) PCT Pub. No.: WO2019/132871
PCT Pub. Date: Jul. 4, 2019

(65) Prior Publication Data
US 2020/0279941 A1     Sep. 3, 2020

(51) Int. Cl.
*H01L 29/66*     (2006.01)
*H01L 29/78*     (2006.01)
*H01L 29/165*    (2006.01)

(52) U.S. Cl.
CPC .......... *H01L 29/785* (2013.01); *H01L 29/165* (2013.01); *H01L 29/66803* (2013.01); *H01L 29/7848* (2013.01)

(58) Field of Classification Search
None
See application file for complete search history.

(56) References Cited

U.S. PATENT DOCUMENTS

2006/0258072 A1\* 11/2006 Kavalieros .......... H01L 29/7391
                                                    257/E29.195
2007/0057325 A1   3/2007 Hsu et al.
(Continued)

FOREIGN PATENT DOCUMENTS

KR    10-2002-0096545    12/2002

OTHER PUBLICATIONS

International Search Report and Written Opinion for International Patent Application No. PCT/US2017/068473 dated Sep. 21, 2018, 15 pgs.

(Continued)

*Primary Examiner* — Ali Naraghi
(74) *Attorney, Agent, or Firm* — Schwabe, Williamson & Wyatt, P.C.

(57) ABSTRACT

Disclosed are etchstop regions in fins of semiconductor devices, and related methods. A semiconductor device includes a buried region, a fin on the buried region, and a gate formed at least partially around the fin. At least a portion of the fin that borders the buried region includes an etchstop material. The etchstop material includes a doped semiconductor material that has a slower etch rate than that of an intrinsic form of the semiconductor material. A method of manufacturing a semiconductor device includes forming a gate on a fin, implanting part of the fin with dopants configured to decrease an etch rate of the part of the fin, removing at least part of the fin, and forming an epitaxial semiconductor material on a remaining proximal portion of the fin.

14 Claims, 7 Drawing Sheets

(56) References Cited

U.S. PATENT DOCUMENTS

| | | | |
|---|---|---|---|
| 2009/0302348 A1* | 12/2009 | Adam | H01L 29/78 |
| | | | 257/190 |
| 2011/0169101 A1* | 7/2011 | Doornbos | H01L 29/105 |
| | | | 257/E21.409 |
| 2012/0161238 A1 | 6/2012 | Scheiper et al. | |
| 2014/0191300 A1* | 7/2014 | Jhaveri | H01L 29/785 |
| | | | 257/288 |
| 2016/0284821 A1* | 9/2016 | Kim | H01L 29/6656 |
| 2016/0351591 A1* | 12/2016 | Xie | H01L 21/845 |
| 2019/0296145 A1* | 9/2019 | Huang | H01L 29/1054 |

OTHER PUBLICATIONS

International Preliminary Report on Patentability for International Patent Application No. PCT/US2017/068473 dated Jul. 9, 2020, 10 pgs.

\* cited by examiner

ETCHSTOP REGIONS IN FINS OF SEMICONDUCTOR DEVICES

CROSS-REFERENCE TO RELATED APPLICATION

This patent application is a U.S. National Phase Application under 35 U.S.C. § 371 of International Application No. PCT/US2017/068473, filed Dec. 27, 2017, entitled "ETCHSTOP REGIONS IN FINS OF SEMICONDUCTOR DEVICES," which designates the United States of America, the entire disclosure of which is hereby incorporated by reference in its entirety and for all purposes.

BACKGROUND

The demand to reduce the size of electronic devices formed using semiconductor wafers has driven the development and proliferation of fin field effect transistors (finFETs), which reduce short-channel effect issues resulting from scaling of transistors, as compared to planar transistors.

DETAILED DESCRIPTION

Figure 1:
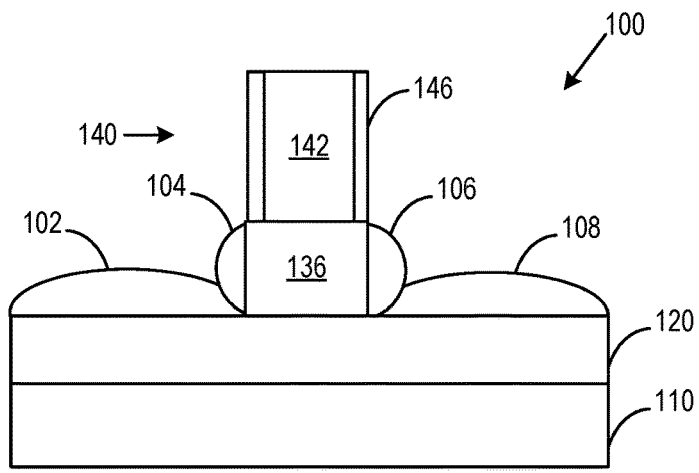
FIG. 1 is a simplified cross-sectional view of a malformed finFET.

Described herein are etchstop regions to prevent exposure of buried regions during removal of portions of fins in semiconductor devices, and related integrated circuit devices, computing devices, and methods. In the following description, various aspects of the illustrative implementations will be described using terms commonly employed by those skilled in the art to convey the substance of their work to others skilled in the art. However, it will be apparent to those skilled in the art that the disclosure may be practiced with only some of the described aspects. For purposes of explanation, specific numbers, materials and configurations are set forth in order to provide a thorough understanding of the illustrative implementations. However, it will be apparent to one skilled in the art that the disclosure may be practiced without the specific details. In other instances, well-known features are omitted or simplified in order not to obscure the illustrative implementations.

Various operations will be described as multiple discrete operations, in turn, in a manner that is most helpful in understanding the disclosure. The order of the description, however, should not be construed to imply that these operations are necessarily order dependent. In particular, these operations need not be performed in the order of presentation.

As used herein, the terms "include," "including," "included," and "includes" mean the same things as the terms "comprise," "comprising," "comprised," and "comprises," and are used interchangeably therewith.

The terms "over," "under," "between," and "on," as used herein, refer to a relative position of one material (e.g., region, structure, layer, etc.) or component with respect to other materials (e.g., regions, structures, layers, etc.) or components. For example, one material disposed over, on, or under another material may be directly in contact with the other material or may have one or more intervening materials in between. Moreover, one material disposed between two materials may be directly in contact with the two materials or may have one or more intervening materials. Unless explicitly stated otherwise, one feature disposed between two features may be in direct contact with the adjacent features or may have one or more intervening layers. In addition, although the terms "over," "under," and "on" may imply a vertical orientation of structures, it is contemplated within the scope of the disclosure that the same structures discussed using these terms may be oriented horizontally, at some non-vertical and non-horizontal angle, or in various other non-linear orientations without departing from the scope of the disclosure.

Implementations of the disclosure may be formed or carried out on a substrate, such as a semiconductor substrate. In one implementation, the semiconductor substrate may be a crystalline substrate formed using a bulk silicon or a silicon-on-insulator (SOI) substructure (e.g., silicon on glass, silicon on sapphire, etc.). In other implementations, the semiconductor substrate may be formed using alternate materials, which may or may not be combined with silicon, that include, but are not limited to, germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include fin field effect transistors (FinFET transistors) such as double-gate transistors and tri-gate transistors, and wrap-around or all-around gate transistors such as nanoribbon and nanowire transistors. Although the implementations described herein may illustrate only FinFET transistors, it should be noted that the disclosure may also be carried out using planar or other nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode is formed on the gate dielectric and may consist of at least one P-type workfunction metal or N-type workfunction metal, depending on whether the transistor is to be a PMOS or an NMOS transistor. In some implementations, the gate electrode may consist of a stack of two or more metals, where one or more metals are workfunction metals and at least one metal is a fill metal. Further metals may be included for other purposes, such as a barrier material.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may include a combination of U-shaped structures and planar, non-U-shaped structures. For example, the gate electrode may consist of one or more U-shaped metals formed atop one or more planar, non-U-shaped materials.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. In further embodiments, one or more metals and/or metal alloys may be used to form the source and drain regions.

One or more interlayer dielectrics (ILDs) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 2:
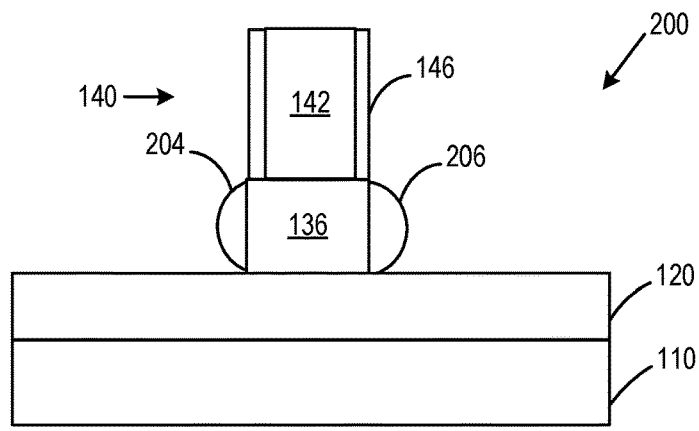
FIG. 2 is a simplified cross-sectional view of another malformed finFET.

Bulk semiconductor material is often removed from source and drain regions of transistors (e.g., FinFETs, planar transistors, etc.) and replaced with crystalline replacement materials to induce strain on channels of the transistors, which improves transistor performance (e.g., channel mobility). Care is taken for accurate source and drain undercut etching to remove the bulk semiconductor material. If a buried region (e.g., a buried oxide (BOX) of a SOI substrate), however, is exposed during removal of the bulk semiconductor material, the crystalline replacement materials may not form properly. FIGS. 1 and 2 illustrate possible malformed finFETs 100, 200 resulting from an exposed BOX. For example, if the BOX is exposed, the crystalline replacement materials for the source and drain may grow on the BOX with poor crystalline quality (FIG. 1) or may not grow on the BOX at all (FIG. 2).

FIG. 1 is a simplified cross-sectional view of a malformed finFET 100. The finFET 100 may be formed on a SOI substrate including a bottom bulk semiconductor material 110, a buried oxide (BOX) 120, and a top bulk semiconductor material (not shown, however a remnant 136 of a fin may include some of the top bulk semiconductor material). The finFET 100 includes a gate 140 (including an electrically conductive material 142 and an electrically insulating material 146) on the remnant 136 of the fin. The finFET 100 also includes a replacement source material 102, 104 and a replacement drain material 108, 106. Portions of the replacement source material 104 and replacement drain material 106 that grew from the remnant 136 of the fin may have good crystalline quality, while portions of the replacement source material 102 and replacement drain material 108 that grew from the BOX 120 (which may be located on a bulk semiconductor material 110) may have poor crystalline quality. Because of the poor crystalline quality of the portions 102, 108, the finFET 100 may not function properly.

FIG. 2 is a simplified cross-sectional view of another malformed finFET 200. The finFET 200 is similar to the finFET 100 of FIG. 1 except that the poor crystalline quality portions 102, 108 of FIG. 1 did not form. Similar to the finFET 100, the finFET 200 may not function properly.

To prevent structures similar to those of the finFETs 100, 200 of FIGS. 1 and 2 from forming, much care is taken to prevent the BOX 120 from being exposed during partial removal of the source and drain regions of the fin. For example, timed source and drain etching is used to monitor how much of the source and drain material is removed. In order to reduce the amount of care used in partially removing the source and drain regions of the fin, etchstop materials may be formed within these regions of the fin to prevent the BOX 120 from being exposed. Disclosed herein are devices including these etchstop regions within source and drain regions, and related methods. For example, using ion implantation, a bottom of source and drain regions in fins may be doped to slow down the etch rate. This implanted doped material can work as an etchstop layer for source and drain undercut etching to prevent exposure of the BOX 120.

By way of non-limiting example, boron doped silicon (Si:B) has a slower etch rate than intrinsic silicon, and is suitable for forming pMOS devices because boron is a p-type dopant. Other suitable p-type dopants include aluminum, Gallium, and indium. Also by way of non-limiting example, carbon doped silicon (Si:C) has a slower etch rate than intrinsic silicon, and is suitable for forming nMOS devices because carbon can induce tensile strain in the channel. Source and drain undercut etch may stop at implanted doped layers of the source and drain, and the BOX 120 may not be exposed.

Figure 3:
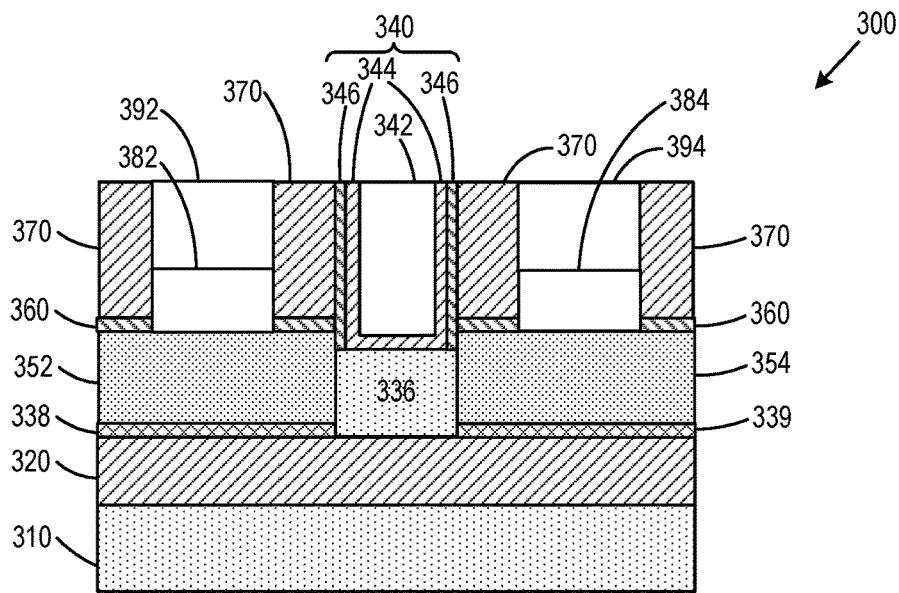
FIG. 3 is a simplified cross-sectional view of a semiconductor device, according to some embodiments of the disclosure.

FIG. 3 is a simplified cross-sectional view of a semiconductor device 300, according to some embodiments of the disclosure. In some embodiments, the semiconductor device 300 includes a bulk semiconductor material 310 and a buried region 320, which may correspond to a bottom semiconductor and a BOX, respectively, of a SOI substrate. A remainder 336 of a fin may include a portion of a top bulk semiconductor material of the SOI substrate (e.g., an intrinsic form of the top bulk semiconductor material). The semiconductor device 300 includes a gate 340 formed on (e.g., at least partially around) the remainder 336 of the fin, a replacement source 352 comprising crystalline semiconductor material, and a replacement drain 354 comprising crystalline semiconductor material. The replacement source 352 and the replacement drain 354 are formed on etchstop materials 338, 339, respectively. The etchstop materials 338, 339 may include dopants selected to cause the etchstop materials 338, 339 to have a slower etch rate than that of an intrinsic form of the semiconductor material from which they were formed. Since the replacement source 352 and the replacement drain 354 are formed on the etchstop materials 338, 339 instead of on the buried region 320, the replacement source 352 and the replacement drain 354 may have good crystalline quality.

The semiconductor device 300 includes an electrical insulator 360 on the replacement source 352 and the replacement drain 354, and an interlayer dielectric (ILD) 370 on the electrical insulator 360. Electrical connection to the replacement source 352 is provided by a source contact 382 and a via 392, which may be formed through the ILD 370 and the electrical insulator 360. Similarly, electrical connection to the replacement drain 354 is provided by a drain contact 384 and a via 394, which may be formed through the ILD 370 and the electrical insulator 360.

The replacement source 352 and the replacement drain 354 induce strain on the remainder 336 of the fin, which improves performance (e.g., channel mobility) of the semiconductor device 300. For example, for a p-type MOS (pMOS) device, compressive strain on the remainder 336 of the fin may be used. For an n-type MOS device (nMOS) device, tensile strain on the remainder 336 of the fin may be used.

In embodiments where the semiconductor device 300 includes a pMOS device, the etchstop materials 338, 339 may include p-type doped semiconductor material. This p-type doped semiconductor material may include a portion of the fin (which may include bulk semiconductor material from a top semiconductor material of the SOI substrate) that was proximate to the buried region 320, and that was doped during fabrication. By way of non-limiting example, the etchstop materials 338, 339 may include boron doped silicon (Si:B). Also by way of non-limiting example, the replacement source 352 and the replacement drain 354 may include boron doped silicon germanium (SiGe:B).

In embodiments where the semiconductor device 300 includes an nMOS device, the etchstop materials 338, 339 may include neutral or n-type doped semiconductor material. This doped semiconductor material may include a portion of the fin that was proximate to the buried region 320, and that was doped during fabrication. By way of non-limiting example, the etchstop materials 338, 339 may include carbon doped silicon (Si:C). Also by way of non-limiting example, the replacement source 352 and the replacement drain 354 may include phosphorus doped silicon (Si:P).

In some embodiments, the bulk semiconductor material 310 and the remainder 336 of the fin may include silicon or some other semiconductor material known in the art (e.g., gallium arsenide, germanium, combinations of silicon and germanium, indium phosphide, III-V semiconductor materials, II-VI semiconductor materials, etc.). In some embodiments, this semiconductor material may include intrinsic semiconductor material. In some embodiments, the buried region 320 includes silicon dioxide, sapphire, some other insulating material, or combinations thereof.

The gate 340 includes a conductive structure 342 comprising electrically conductive material and insulating structures 344, 346 comprising electrically insulating materials. By way of non-limiting example, the conductive structure 342 may include polysilicon, highly doped semiconductor material, a metal (e.g., hafnium, zirconium, titanium, tantalum, aluminum, copper, tungsten, platinum, alloys of these metals, or carbides of these metals such as hafnium carbide, zirconium carbide, titanium carbide, tantalum carbide, and aluminum carbide), other electrically conductive materials, or combinations thereof.

The electrical insulator 360 and the insulating structures 344, 346 include electrically insulating materials. By way of non-limiting example, the electrically insulating materials may include oxide materials (e.g., silicon dioxide ($SiO_2$), silicon oxide (SiO), etc.), nitride materials (e.g., silicon nitride, etc.), high-k dielectric materials, other electrically insulating materials, or combinations thereof. The electrical insulator 360 and the insulating structures 344, 346 may include unitary, compound, or stacked structures in various embodiments. Insulating structure 346 may serve as a gate oxide, and may include a stacked structure in some embodiments.

The vias 392, 394 and the contacts 382, 384 may include electrically conductive materials. By way of non-limiting example, the electrically conductive material may include any of the materials discussed with reference to the conductive structure 342 of the gate 340.

Together, the etchstop materials 338, 339, the replacement source 352, the remainder 336 of the fin, and the replacement drain 354 form a fin for a finFET transistor. As a result, the semiconductor device 300 may include a finFET transistor including the buried region 320, the fin (including the etchstop materials 338, 339, the replacement source 352, the remainder 336 of the fin, and the replacement drain 354), and the gate 340 at least partially around the fin. The etchstop materials 338, 339 include a doped semiconductor material that has a slower etch rate than that of an intrinsic form of the semiconductor material. The fin, therefore, may comprise a doped epitaxial semiconductor material formed on the etchstop materials 338, 339.

In some embodiments, an integrated circuit includes the semiconductor device 300. The integrated circuit may include a SOI substrate including a BOX (e.g., the buried region 320). The integrated circuit may also include one or more source or drain regions. Individual ones of the one or more source or drain regions includes an etchstop material along the BOX and a semiconductor material epitaxially formed on the etchstop material (e.g., the etchstop material 338 and the replacement source 352 and/or the etchstop material 339 and the replacement drain 354). The etchstop material includes silicon from the SOI substrate and dopants that reduced the etch rate of the etchstop material to be less than that of intrinsic silicon. In some embodiments, the dopants include p-type dopants (e.g., boron). In some embodiments, the dopants include neutral dopants (e.g., carbon, which has a smaller lattice constant than intrinsic silicon, resulting in tensile strain induced in the channel 336). In some embodiments, the dopants include n-type dopants (e.g., phosphorus, arsenic, antimony, tellurium, etc.). In some embodiments, the dopants may include carbon and some other type of dopant in combination with carbon (a co-doping). In some embodiments, the semiconductor material on the etchstop material includes boron doped silicon and germanium (SiGe:B). In some embodiments, the semiconductor material on the etchstop material includes phosphorus doped silicon (Si:P).

Figure 4:
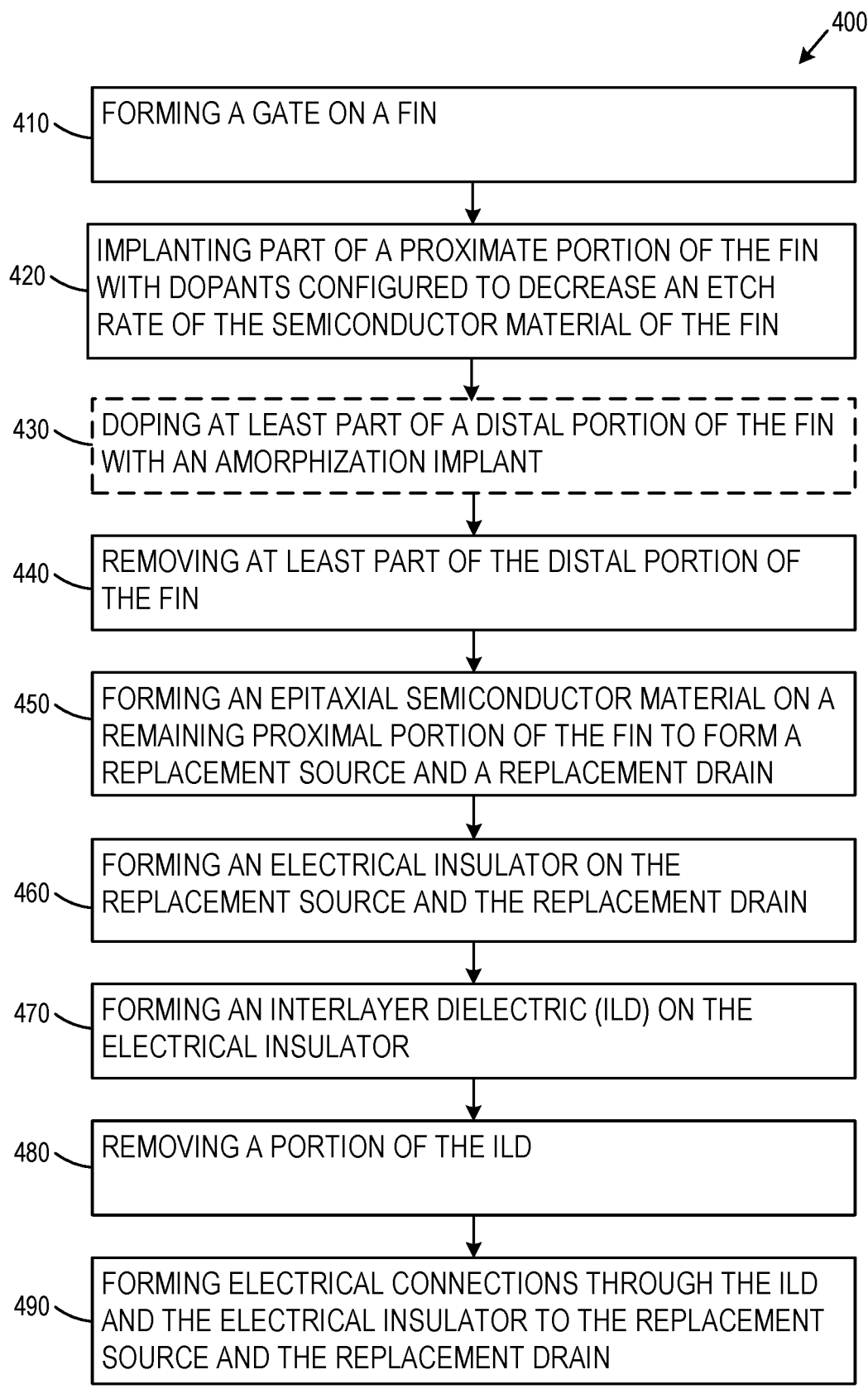
FIG. 4 is a simplified flowchart illustrating a method of forming a semiconductor device, according to some embodiments.

FIG. 4 is a simplified flowchart illustrating a method 400 of forming a semiconductor device (e.g., the semiconductor device 300 of FIG. 3), according to some embodiments.

FIGS. 5A-5J are simplified cross-sectional views illustrating method acts of the method 400 of FIG. 4.

Figure 5A:
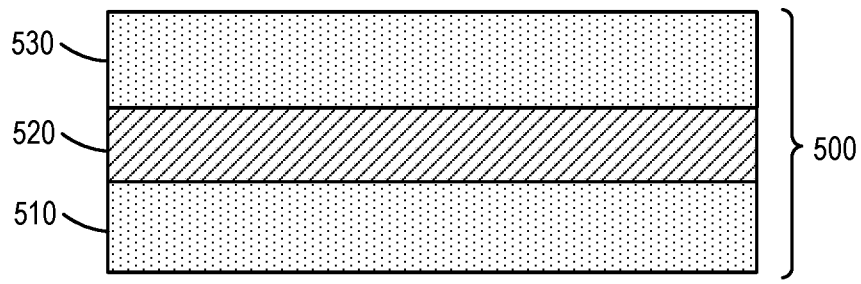
FIGS. 5A-5J are simplified cross-sectional views illustrating method acts of the method of FIG. 4.

FIG. 5A is a simplified cross-sectional view of a semiconductor on insulator structure 500 (sometimes referred to herein as "structure" 500). The structure 500 includes a bulk semiconductor material 510, a buried region 520 on the bulk semiconductor material 510, and a fin 530 comprising semiconductor material on the buried region 520. In some embodiments, the structure 500 may be formed from a SOI substrate by removing portions of a top bulk semiconductor material 510 to produce fins such as the fin 530 of FIG. 5A. The bulk semiconductor material 510 and the buried region 520 may be similar to the bulk semiconductor material 310 and the buried region 320 discussed above with reference to FIG. 3.

Figure 5B:
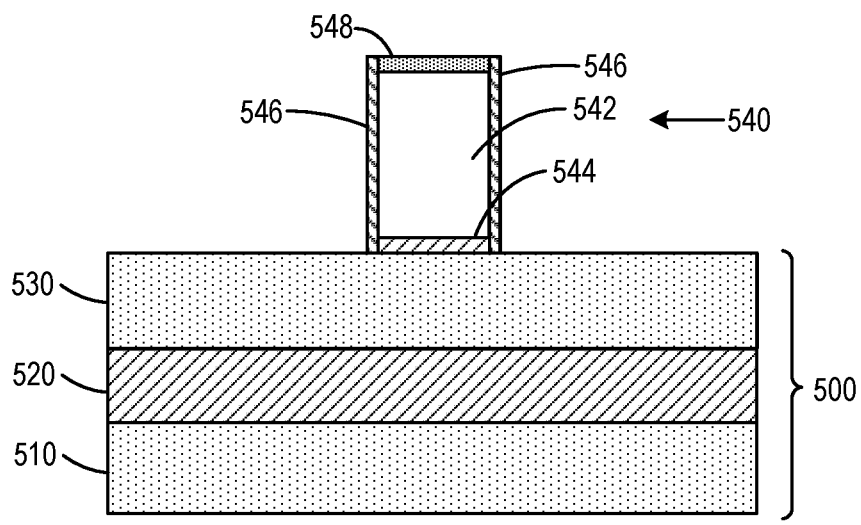

Referring to FIGS. 4 and 5A-5J together, the method 400 includes forming 410 a gate 540 on the fin 530. FIG. 5B illustrates the gate 540 on the fin 530. In embodiments where a finFET is to be formed, the gate 540 may be formed at least partially around the fin 530, which is not shown in FIG. 5A as FIG. 5A is merely a cross-sectional view taken along the fin 530. The gate 540 may include a conductive structure 542 and insulating structures 544, 546 similar to the conductive structure 342 and insulating structures 344, 346 discussed above with reference to FIG. 3. The gate 540 may also include a mask 548 (e.g., a nitride hard mask) on the conductive structure 542. The mask 548 may be configured to protect the conductive structure 542 from processing that is performed on the semiconductor device 300, as will be discussed below.

Figure 5C:
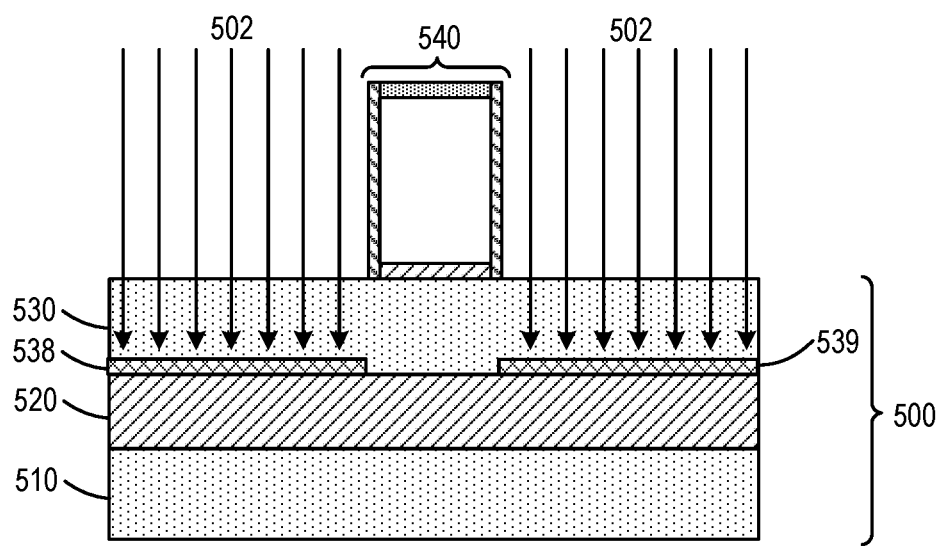

The method 400 also includes implanting 420 part of a proximate portion of the fin 530 that is proximate to the buried region 520 with dopants 502. The dopants 502 are selected to decrease an etch rate of the semiconductor material of the fin 530, which reduces the likelihood that the buried region 520 will be exposed when source and drain regions of the fin 530 are removed (see discussion regarding removing 440 below). FIG. 5C illustrates the dopants 502 being applied, which forms etchstop materials 538, 539 at the proximate portion of the fin 530. The etchstop materials 538, 539 may be similar to the etchstop materials 338, 339 discussed above with reference to FIG. 3.

In some embodiments, implanting 420 part of a proximate portion of the fin 530 includes implanting the proximate portion of the fin 530 with boron. In some embodiments, implanting 420 part of a proximate portion of the fin 530 includes implanting the proximate portion of the fin 530 with carbon.

Figure 5D:
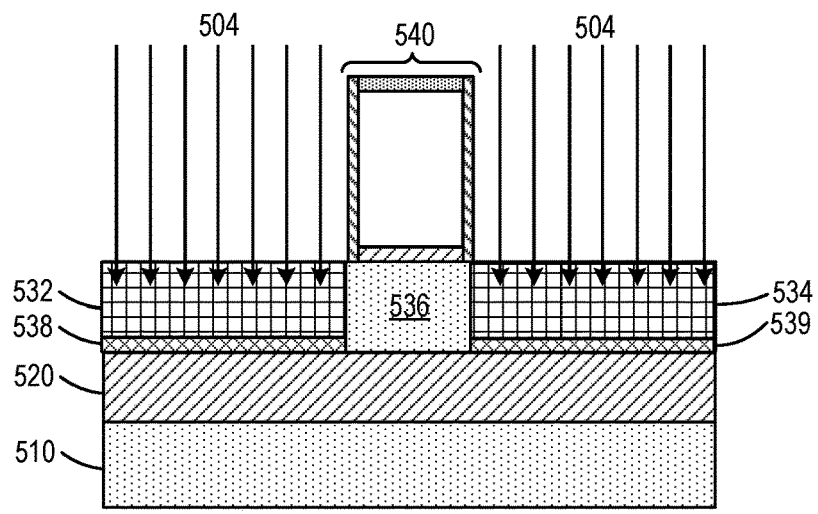

In some embodiments, the method 400 optionally includes doping 430 at least part of a distal portion of the fin 530 that is distal to the buried region 520 with an amorphization implant 504 (shown in FIG. 4 in dashed lines to indicate that this act is optional). FIG. 5D illustrates the amorphization implant 504 (silicon or germanium are example ion species for preamorphization implant), and an amorphous source region 532 and an amorphous drain region 534 resulting from the amorphization implant 504. The use of etchstop materials 538, 539 with the amorphization implant 504 increases etch selectivity between the etchstop materials 538, 539 and the amorphous source region 532 and the amorphous drain region 534. In some embodiments, doping the distal portion of the fin 530 with the amorphization implant 504 includes doping the distal portion of the fin 530 with silicon for an n-type device, or doping the distal portion of the fin 530 with silicon and germanium for a p-type device.

Figure 5E:
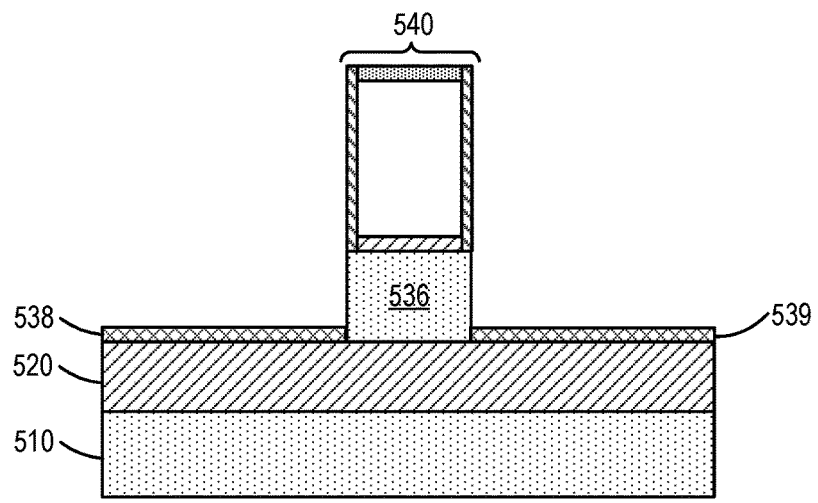

Regardless of whether or not an amorphization implant 504 is used, the method 400 includes removing 440 at least part of the distal portion of the fin 530. FIG. 5E illustrates the etchstop materials 538, 539 without the distal portion of the fin 530 thereon. In some embodiments, removing 440 at least part of the distal portion of the fin 530 includes etching the distal portion of the fin 530. Although the etchstop materials 538, 539 and other materials and regions in the various drawings are shown with hard boundaries, it will be apparent to one skilled in the art that many of these materials and regions may have soft, gradual, and/or non-uniform boundaries. As a result, although not shown in FIG. 5E, in some embodiments, a portion of the fin 530 may still be present on the etchstop materials 538, 539.

As illustrated in FIGS. 5C-5E, the gate 540 may shield a remainder 536 of the fin 530 from the implanting 420, the doping 430, and the removing 440.

Figure 5F:
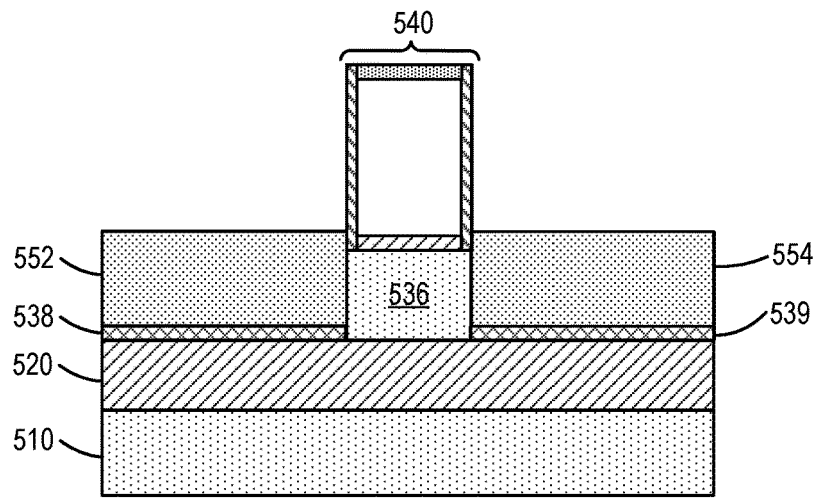

The method 400 further includes forming 450 an epitaxial semiconductor material on the remaining proximal portion of the fin 530, which includes the etchstop materials 538, 539. FIG. 5F illustrates a replacement source 552 comprising crystalline semiconductor material and a replacement drain 554 comprising crystalline semiconductor material resulting from the forming 450. The replacement source 552 and the replacement drain 554 may be similar to the replacement source 352 and the replacement drain 354 discussed above with reference to FIG. 3.

Figure 5G:
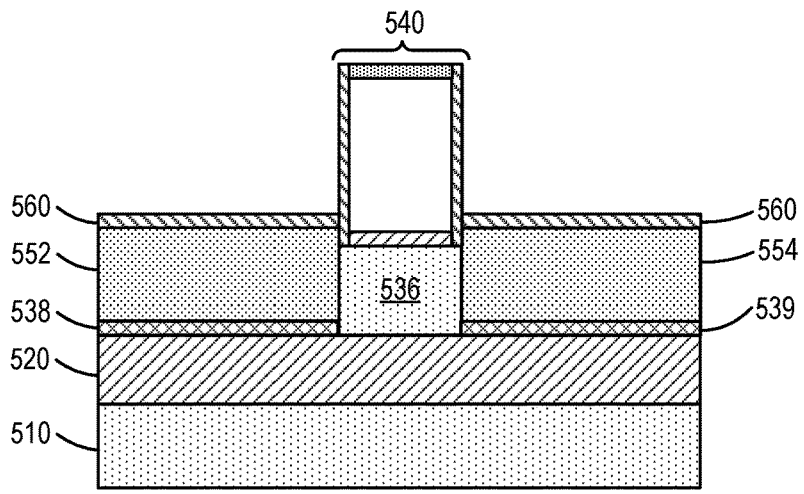

The method 400 also includes forming 460 an electrical insulator 560 including electrically insulating material on the replacement source 552 and the replacement drain 554. FIG. 5G illustrates the electrical insulator 560 on the replacement source 552 and the replacement drain 554. The electrical insulator 560 may be similar to the electrical insulator 360 discussed above with reference to FIG. 3.

Figure 5H:
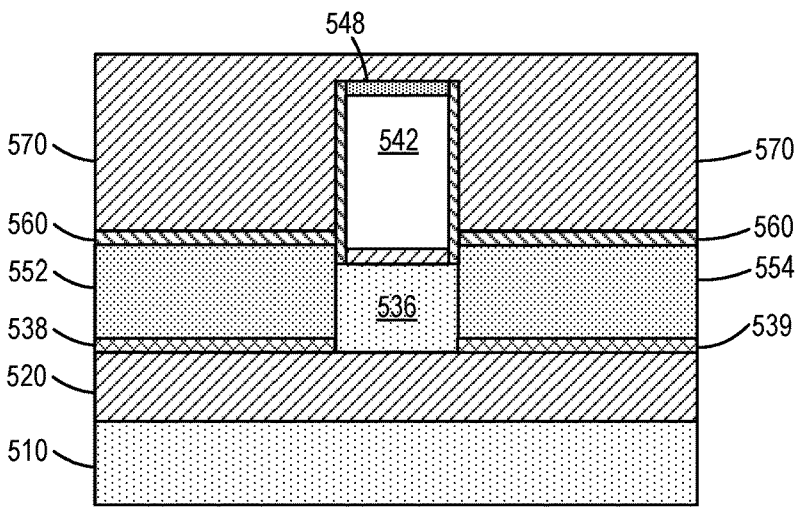

The method 400 further includes forming 470 an interlayer dielectric (ILD) 570 on the electrical insulator 560. FIG. 5H illustrates the ILD 570 on the electrical insulator 560 and on the mask 548. In some embodiments, forming 470 an ILD 570 includes spinning the ILD 570 onto the electrical insulator 560. In some embodiments, the ILD 570 may extend above the mask 548, as illustrated in FIG. 5H.

Figure 5I:
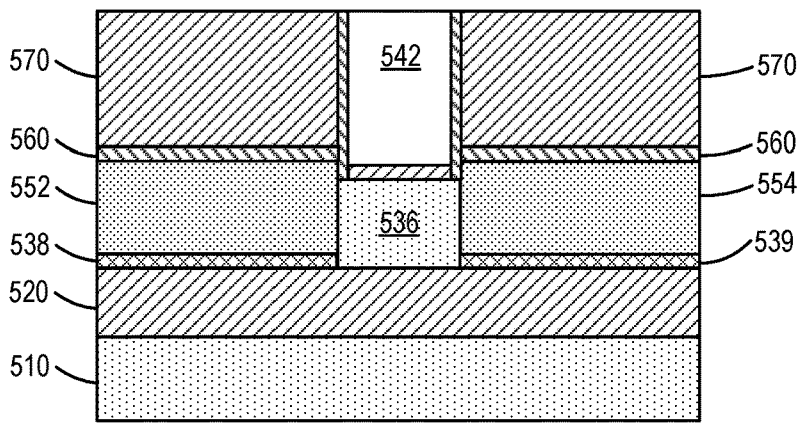

The method 400 also includes removing 480 a portion of the ILD 570. FIG. 5I illustrates ILD 570 with the portion removed, along with the mask 548 of the gate 540. By way of non-limiting example, removing 480 the portion of the ILD 570 may include polishing off the portion of the ILD 570 and the mask 548.

Figure 5J:
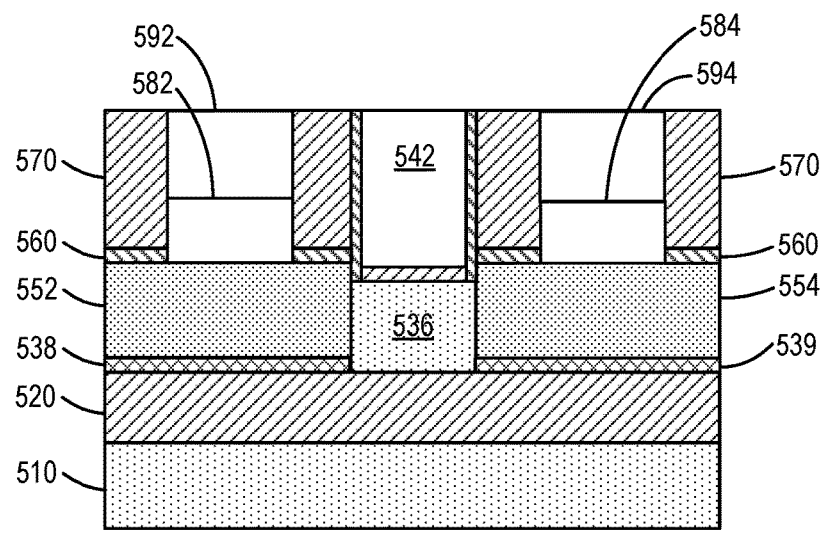

The method 400 further includes forming 490 electrical connections through the ILD 570 and the electrical insulator 560 to the replacement source 552 and to the replacement drain 554. In some embodiments, forming 490 electrical connections through the ILD 570 to the replacement source 552 and to the replacement drain 554 includes forming contacts 582, 584 and vias 592, 594 through the ILD 570. FIG. 5J illustrates the contacts 582, 584 and the vias 592, 594. The contacts 582, 584 and the vias 592, 594 may be similar to the contacts 382, 384 and the vias 392, 394 discussed above with reference to FIG. 3.

The resulting structure illustrated in FIG. 5J is similar to the semiconductor device 300 of FIG. 3. As a result, the semiconductor device 300 of FIG. 3 may be formed using methods similar to the method 400 of FIG. 4.

Figure 6:
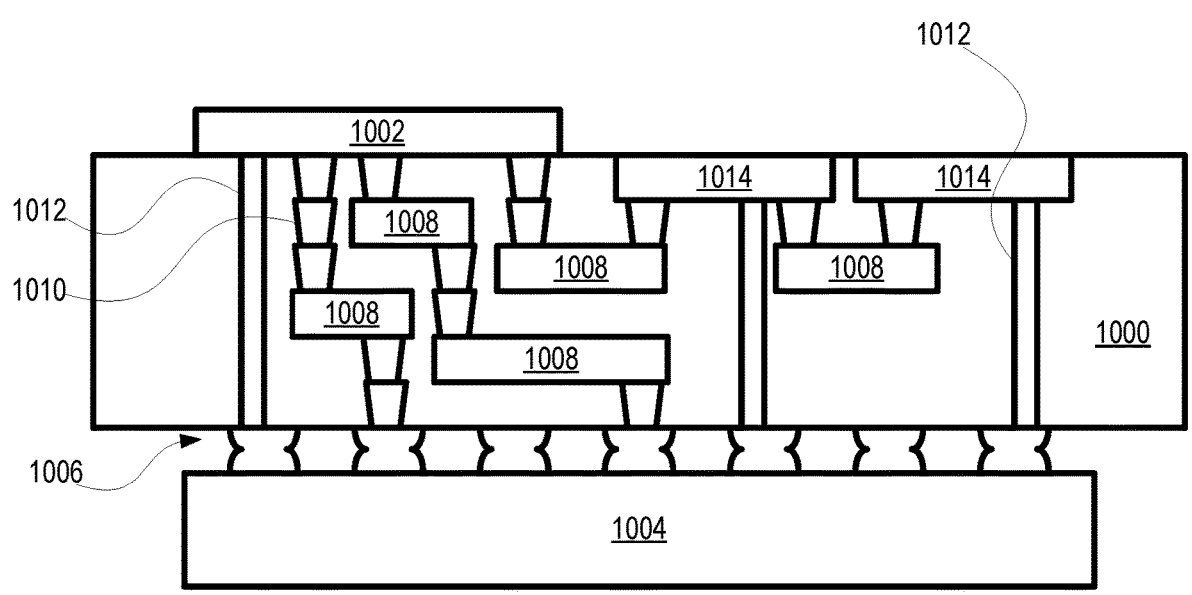
FIG. 6 illustrates an interposer that includes one or more embodiments of the disclosure.

FIG. 6 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the disclosure, apparatuses or processes disclosed herein may be used in the fabrication of interposer 1000. By way of non-limiting example, at least one of the first substrate 1002 or the second substrate 1004 may include a semiconductor device similar to the semiconductor device 300 discussed above with reference to FIG. 3.

Figure 7:
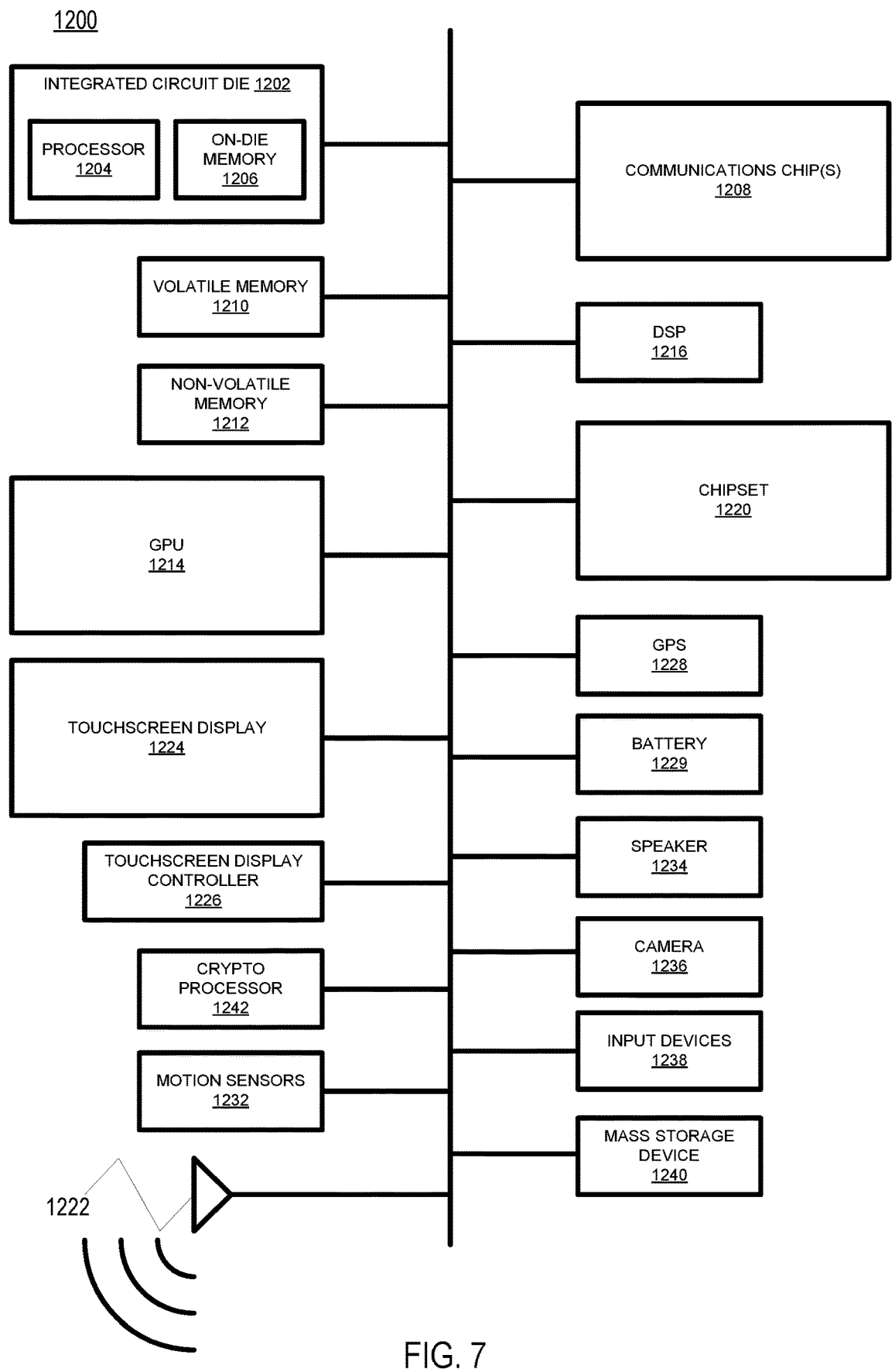
FIG. 7 illustrates a computing device in accordance with one embodiment of the disclosure.

FIG. 7 illustrates a computing device 1200 in accordance with one embodiment of the disclosure. The computing device 1200 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1200 include, but are not limited to, an integrated circuit die 1202 and at least one communications chip 1208 (also referred to herein as "communications logic unit" 1208). In some implementations the communications chip 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a processor 1204 (e.g., a CPU) as well as on-die memory 1206, often used as cache memory, which can be provided by technologies such as embedded DRAM (eDRAM), SRAM, or spin-transfer torque memory (STT-MRAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit (GPU) 1214, a digital signal processor (DSP) 1216, a crypto processor 1242 (e.g., a specialized processor that executes cryptographic algorithms within hardware), a chipset 1220, at least one antenna 1222 (in some implementations two or more antenna may be used), a display or a touchscreen display 1224, a touchscreen display controller 1226, a battery 1229 or other power source (not shown), a power amplifier (not shown), a voltage regulator (not shown), a global positioning system (GPS) device 1228, a compass (not shown), one or more motion sensors 1232 (e.g., a motion coprocessor such as an accelerometer, a gyroscope, a compass, etc.), a microphone (not shown), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver) that is used to communicate over a distance by modulating and radiating electromagnetic waves in air or space.

The communications chip 1208 may include a communications logic unit configured to transfer data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1200 may include a plurality of communications chips 1208. For instance, a first communications chip 1208 may be dedicated to shorter range wireless communications such as Wi-Fi, NFC, and Bluetooth and a second communications chip 1208 may be dedicated to longer range wireless communications such as GPS, EDGE, GPRS, CDMA, WiMAX, LTE, Ev-DO, and others.

The processor 1204 of the computing device 1200 includes one or more semiconductor devices similar to or the same as the semiconductor device 300 of FIG. 3. The term "processor" may refer to any device or portion of a device that processes electronic data from registers and/or memory to transform that electronic data into other electronic data that may be stored in registers and/or memory.

The communications logic unit 1208 may also include one or more semiconductor devices similar to or the same as the semiconductor device 300 of FIG. 3.

In further embodiments, another component housed within the computing device 1200 may contain one or more semiconductor devices similar to or the same as the semiconductor device 300 of FIG. 3.

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

In some embodiments, a computing device includes a semiconductor structure (e.g., similar to the semiconductor device 300 of FIG. 3) of one or more transistors. The semiconductor structure includes a source region, a drain region, and a gate including electrically conductive material formed on a semiconductor region between the source region and the drain region. The source region includes a source etchstop region on a buried oxide (BOX) and a source epitaxial region including epitaxial semiconductor material formed on the source etchstop region. The drain region includes a drain etchstop region on the BOX and a drain epitaxial region including epitaxial semiconductor material formed on the drain etchstop region. In some embodiments, the computing device includes a processor mounted on a substrate, a memory unit capable of storing data, a graphics processing unit, an antenna within the computing device, a battery within the computing device, a power amplifier within the processor, and a voltage regulator within the processor. At least one of the processor, the memory unit, the graphics processing unit, the antenna, the display, the battery, the power amplifier, or the voltage regulator includes the semiconductor structure.

EXAMPLES

The following is a non-exhaustive list of example embodiments that fall within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1

A semiconductor device, comprising: a buried region comprising an oxide material; a fin on the buried region, at least a portion of the fin that borders the buried region comprising an etchstop material, the etchstop material comprising a doped semiconductor material that has a slower etch rate than that of an intrinsic form of the doped semiconductor material; and a gate formed at least partially around the fin, the gate comprising electrically conductive material.

Example 2

The semiconductor device of Example 1, wherein the doped semiconductor material of the etchstop material comprises a p-type doped semiconductor material.

Example 3

The semiconductor device of Example 2, wherein the p-type doped semiconductor material comprises boron doped silicon.

Example 4

The semiconductor device according to any one of Examples 1-3, wherein the doped semiconductor material comprises a carbon doped silicon.

Example 5

The semiconductor device according to any one of Examples 1-4, wherein the doped semiconductor material comprises at least one n-type doped semiconductor material selected from the list consisting of phosphorus, arsenic, and antimony.

Example 6

The semiconductor device according to any one of Examples 1-5, wherein a portion of the fin around which the gate was formed comprises an intrinsic form of the semiconductor material.

Example 7

The semiconductor device according to any one of Examples 1-6, wherein the fin further comprises a doped epitaxial semiconductor material formed on the etchstop material.

Example 8

The semiconductor device according to any one of Examples 1-3, 6, and 7, wherein the fin further comprises silicon and germanium epitaxially formed on the etchstop material, the silicon and germanium doped with a p-type dopant selected from the group consisting of boron, aluminum, gallium, and indium.

Example 9

The semiconductor device according to any one of Examples 1 and 4-7, wherein the fin further comprises silicon epitaxially formed on the etchstop material, the silicon doped with at least one n-type dopant selected from the group consisting of phosphorus, arsenic, antimony, and tellurium.

Example 10

The semiconductor device according to any one of Examples 1-9, wherein the buried region comprises a buried oxide (BOX) of a silicon on insulator (SOI) substrate.

Example 11

An integrated circuit, comprising: a silicon on insulator (SOI) substrate comprising a buried oxide (BOX); one or more source or drain regions on the BOX, individual ones of the one or more source or drain regions comprising: an etchstop material along the BOX, the etchstop material comprising silicon from the SOI substrate and dopants that reduced the etch rate of the etchstop material to be less than that of intrinsic silicon; and a semiconductor material epitaxially formed on the etchstop material.

Example 12

The integrated circuit of Example 11, wherein the dopants comprise p-type dopants.

Example 13

The integrated circuit of Example 12, wherein the dopants comprise boron.

Example 14

The integrated circuit of Example 11, wherein the dopants comprise n-type dopants.

Example 15

The integrated circuit of Example 14, wherein the dopants comprise carbon.

Example 16

The integrated circuit according to any one of Examples 11-13, wherein the semiconductor material on the etchstop material comprises silicon and germanium doped with at least one p-type dopant selected from the group consisting of boron, aluminum, gallium and indium.

Example 17

The integrated circuit according to any one of Examples 11, 14, and 15, wherein the semiconductor material on the etchstop material comprises silicon doped with at least one n-type dopant selected from the group consisting of phosphorous, arsenic, antimony, and tellurium.

Example 18

A method of manufacturing a semiconductor device, the method comprising: forming a gate on a fin comprising semiconductor material; implanting part of a proximate portion of the fin that is proximate to a buried region comprising electrically insulating material with dopants configured to decrease an etch rate of the semiconductor material; removing at least part of a distal portion of the fin that is remote from the buried region; and forming an epitaxial semiconductor material on a remaining proximal portion of the fin.

Example 19

The method of Example 18, wherein implanting part of a proximate portion of the fin with dopants comprises implanting the proximate portion of the fin with boron.

Example 20

The method of Example 18, wherein implanting part of a proximate portion of the fin with dopants comprises implanting the proximate portion of the fin with carbon.

Example 21

The method according to any one of Examples 18-20, further comprising doping the distal portion of the fin with an amorphization implant prior to removing the distal portion of the fin.

Example 22

The method of Example 21, wherein doping the distal portion of the fin with an amorphization implant comprises: doping the distal portion of the fin with silicon for an n-type device; or doping the distal portion of the fin with silicon and germanium for a p-type device.

Example 23

A computing device comprising: a semiconductor structure of one or more transistors, the semiconductor structure comprising: a source region comprising a source etchstop region on a buried oxide (BOX) and a source epitaxial region comprising epitaxial semiconductor material formed on the source etchstop region; a drain region comprising a drain etchstop region on the BOX and a drain epitaxial region comprising epitaxial semiconductor material formed on the drain etchstop region; and a gate comprising electrically conductive material formed on a semiconductor region between the source region and the drain region.

Example 24

The computing device of Example 23, further comprising: a processor mounted on a substrate; a memory unit capable of storing data; a graphics processing unit; an antenna within the computing device; a display on the computing device; a battery within the computing device; a power amplifier within the processor; and a voltage regulator within the processor; wherein the at least one of the processor, the memory unit, the graphics processing unit, the antenna, the display, the battery, the power amplifier, or the voltage regulator includes the semiconductor structure.

Example 25

A method of forming a semiconductor device, the method comprising: forming a buried region comprising an oxide material; forming a fin on the buried region, at least a portion of the fin that borders the buried region comprising an etchstop material, the etchstop material comprising a doped semiconductor material that has a slower etch rate than that of an intrinsic form of the doped semiconductor material; and forming a gate formed at least partially around the fin, the gate comprising electrically conductive material.

Example 26

The method of Example 25, wherein forming a fin comprises forming the fin with the doped semiconductor material of the etchstop material comprising a p-type doped semiconductor material.

Example 27

The method of Example 26, wherein the p-type doped semiconductor material comprises boron doped silicon.

Example 28

The method according to any one of Examples 25-27, wherein the doped semiconductor material comprises a carbon doped silicon.

Example 29

The method according to any one of Examples 25-28, wherein the doped semiconductor material comprises at least one n-type doped semiconductor material selected from the list consisting of phosphorus, arsenic, and antimony.

Example 30

The method according to any one of Examples 25-29, wherein a portion of the fin around which the gate was formed comprises an intrinsic form of the semiconductor material.

Example 31

The method according to any one of Examples 25-30, wherein forming a fin further comprises forming the fin with a doped epitaxial semiconductor material formed on the etchstop material.

Example 32

The method according to any one of Examples 25-27, wherein forming a fin comprises forming the fin further with silicon and germanium epitaxially formed on the etchstop material, the silicon and germanium doped with a p-type dopant selected from the group consisting of boron, aluminum, gallium, and indium.

Example 33

The method according to any one of Examples 25 and 28-31, wherein forming a fin comprises forming the fin with silicon epitaxially formed on the etchstop material, the silicon doped with at least one n-type dopant selected from the group consisting of phosphorus, arsenic, antimony, and tellurium.

Example 34

The method according to any one of Examples 25-33, wherein the buried region comprises a buried oxide (BOX) of a silicon on insulator (SOI) substrate.

Example 35

A method of forming an integrated circuit, comprising: forming one or more source or drain regions on a buried oxide (BOX) of a silicon on insulator (SOI) substrate, individual ones of the one or more source or drain regions, the forming comprising: forming an etchstop material along the BOX, the etchstop material comprising silicon from the SOI substrate and dopants that reduced the etch rate of the etchstop material to be less than that of intrinsic silicon; and forming a semiconductor material epitaxially on the etchstop material.

Example 36

The method of Example 35, wherein the dopants comprise p-type dopants.

Example 37

The method of Example 36, wherein the dopants comprise boron.

Example 38

The method of Example 35, wherein the dopants comprise n-type dopants.

Example 39

The method of Example 38, wherein the dopants comprise carbon.

Example 40

The method according to any one of Examples 35-37, wherein forming a semiconductor material on the etchstop material comprises forming silicon and germanium doped with at least one p-type dopant selected from the group consisting of boron, aluminum, gallium and indium.

Example 41

The method according to any one of Examples 35, 38, and 39, wherein forming a semiconductor material on the etchstop material comprises forming silicon doped with at least one n-type dopant selected from the group consisting of phosphorous, arsenic, antimony, and tellurium.

Example 42

A semiconductor device, comprising: a gate on a fin comprising semiconductor material; part of a proximate portion of the fin that is proximate to a buried region comprising electrically insulating material implanted with dopants configured to decrease an etch rate of the semiconductor material; and an epitaxial semiconductor material on the part of the proximal portion of the fin.

Example 43

The semiconductor device of Example 42, wherein the part of a proximate portion of the fin includes boron dopants.

Example 44

The semiconductor device of Example 42, wherein the part of the proximate portion of the fin comprises carbon dopants.

Example 45

The semiconductor device according to any one of Examples 42-44, wherein the distal portion of the fin includes dopants from an amorphization implant.

Example 46

The semiconductor device of Example 45, wherein the dopants from the amorphization implant include silicon dopants for an n-type device or silicon and germanium dopants for a p-type device.

Example 47

A method of operating a computing device, the method comprising: operating a semiconductor structure of one or more transistors, the semiconductor structure comprising: a source region comprising a source etchstop region on a buried oxide (BOX) and a source epitaxial region comprising epitaxial semiconductor material formed on the source etchstop region; a drain region comprising a drain etchstop region on the BOX and a drain epitaxial region comprising epitaxial semiconductor material formed on the drain etchstop region; and a gate comprising electrically conductive material formed on a semiconductor region between the source region and the drain region.

Example 48

The method of Example 47, further comprising: operating a processor mounted on a substrate; operating a memory unit capable of storing data; operating a graphics processing unit; operating an antenna within the computing device; operating a display on the computing device; operating a battery within the computing device; operating a power amplifier within the processor; and operating a voltage regulator within the processor; wherein the at least one of the processor, the memory unit, the graphics processing unit, the antenna, the display, the battery, the power amplifier, or the voltage regulator includes the semiconductor structure.

Example 49

A computer-readable storage medium having computer-readable instructions stored thereon, the computer-readable instructions configured to instruct one or more processors to perform at least a portion of the method according to any one of Examples 18-22, 25-41, 47, and 48.

Example 50

A means for performing the method according to any one of Examples 18-22, 25-41, 47, and 48.

CONCLUSION

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A semiconductor device, comprising:
    a buried region comprising an oxide material;
    a fin on the buried region, at least a portion of the fin that borders the buried region comprising an etchstop material, the etchstop material comprising a doped semiconductor material, wherein the fin further comprises a doped epitaxial semiconductor material on the etchstop material; and
    a gate formed at least partially around a portion of the fin, the gate comprising electrically conductive material, wherein the doped epitaxial semiconductor material is in contact with the portion of the fin beneath the gate.

2. The semiconductor device of claim 1, wherein the doped semiconductor material of the etchstop material comprises a p-type doped semiconductor material.

3. The semiconductor device of claim 2, wherein the p-type doped semiconductor material comprises boron doped silicon.

4. The semiconductor device of claim 1, wherein the doped semiconductor material comprises a carbon doped silicon.

5. The semiconductor device of claim 1, wherein the doped semiconductor material comprises at least one n-type doped semiconductor material selected from the list consisting of phosphorus, arsenic, and antimony.

6. The semiconductor device of claim 1, wherein the portion of the fin around which the gate was formed comprises an intrinsic form of the semiconductor material.

7. The semiconductor device of claim 1, wherein the fin further comprises silicon and germanium epitaxially formed on the etchstop material, the silicon and germanium doped with a p-type dopant selected from the group consisting of boron, aluminum, gallium, and indium.

8. The semiconductor device of claim 1, wherein the doped epitaxial semiconductor material comprises silicon epitaxially formed on the etchstop material, the silicon doped with at least one n-type dopant selected from the group consisting of phosphorus, arsenic, antimony, and tellurium.

9. The semiconductor device of claim 1, wherein the buried region comprises a buried oxide (BOX) of a silicon on insulator (SOI) substrate.

10. A method of manufacturing a semiconductor device, the method comprising:
    forming a gate on a fin comprising semiconductor material;
    implanting part of a proximate portion of the fin that is proximate to a buried region comprising electrically insulating material with dopants configured to decrease an etch rate of the semiconductor material;

removing at least part of a distal portion of the fin that is remote from the buried region;

forming an epitaxial semiconductor material on a remaining proximal portion of the fin; and forming a gate at least partially around a portion of the fin, the gate comprising electrically conductive material, wherein the epitaxial semiconductor material is in contact with the portion of the fin beneath the gate.

11. The method of claim 10, wherein implanting part of a proximate portion of the fin with dopants comprises implanting the proximate portion of the fin with boron.

12. The method of claim 10, wherein implanting part of a proximate portion of the fin with dopants comprises implanting the proximate portion of the fin with carbon.

13. The method of claim 10, further comprising doping the distal portion of the fin with an amorphization implant prior to removing the distal portion of the fin.

14. The method of claim 13, wherein doping the distal portion of the fin with an amorphization implant comprises:

doping the distal portion of the fin with silicon for an n-type device; or doping the distal portion of the fin with silicon and germanium for a p-type device.

\* \* \* \* \*